United States Patent
Yang

(10) Patent No.: US 9,653,556 B1
(45) Date of Patent: May 16, 2017

(54) FIELD PLATE FOR HIGH-VOLTAGE FIELD EFFECT TRANSISTORS

(71) Applicant: Toshiba Corporation, Minato-ku, Tokyo (JP)

(72) Inventor: Long Yang, Union City, CA (US)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 15/056,765

(22) Filed: Feb. 29, 2016

(51) Int. Cl.
*H01L 29/15* (2006.01)
*H01L 29/40* (2006.01)
*H01L 29/20* (2006.01)
*H01L 29/205* (2006.01)
*H01L 29/778* (2006.01)

(52) U.S. Cl.
CPC ........ *H01L 29/402* (2013.01); *H01L 29/2003* (2013.01); *H01L 29/205* (2013.01); *H01L 29/7787* (2013.01)

(58) Field of Classification Search
CPC ... H01L 29/402; H01L 29/405; H01L 29/205; H01L 29/778; H01L 29/7787; H01L 29/66431; H01L 29/66462
USPC ....................................................... 257/76
See application file for complete search history.

(56) References Cited

U.S. PATENT DOCUMENTS

| 2008/0272397 A1* | 11/2008 | Koudymov | H01L 29/1606 257/192 |
| 2011/0084354 A1* | 4/2011 | Honda | H01L 29/0615 257/493 |
| 2016/0141405 A1* | 5/2016 | Werner | H01L 29/7786 257/76 |

OTHER PUBLICATIONS

Wataru Saito et al., "Field-Plate Structure Dependence of Current Collapse Phenomena in High-Voltage GaN-HEMTs", IEEE Electron Device Letters, vol. 31, No. 7, pp. 659-661 (Jul. 2010).
Vassil Palankovski et al., "Field-Plate Optimization of AlGaN/GaN HEMTs", CSIC 2006, IEEE, pp. 107-110, (Nov. 2006).
Huili Xing et al., "High Breakdown Foltage AlGaN—GaN HEMTs Achieved by Multiple Field Plates", IEEE Electron Device Leters, vol. 25, No. 4, pp. 161-163, (Apr. 2004).
Wataru Saito et al., "Current Colapseless High-Voltage GaN-HEMT and its 50-W Boost Converter Operation", IEDM 2007, IEEE International, pp. 869-872, (Dec. 2007).

* cited by examiner

*Primary Examiner* — Tu-Tu Ho
(74) *Attorney, Agent, or Firm* — White & Case LLP

(57) ABSTRACT

A high voltage semiconductor structure with a field plate comprising a depletable material that increases the breakdown voltage of the semiconductor structure. A depletion region forms within the depletable field plate which redistributes the electric field and preventing electric charges from concentrating at the corners of the field plate. The thickness, doping concentration, doping uniformity, and geometric shape of the field plates may be adjusted to optimize the effect of the charge redistribution.

15 Claims, 5 Drawing Sheets

FIELD PLATE FOR HIGH-VOLTAGE FIELD EFFECT TRANSISTORS

FIELD OF THE INVENTION

The present invention provides an improvement over prior art field plates, particularly for high voltage transistors, i.e. HEMTs or MOSFETs.

BACKGROUND OF THE INVENTION

Field plates are used in high-electron-mobility transistors ("HEMT") and metal-oxide-semiconductor field-effect transistors ("MOSFET") to manipulate and reshape electric field distribution to reduce the maximum electric field of these transistors when high voltages are applied to the drain electrode. By reducing the maximum electric field, field plates increase the breakdown voltage and therefore achieve operations at higher voltages.

A comparison of FIG. 1 and FIG. 2 shows the benefit of a conventional field plate comprising metal. The transistor 100 in FIG. 1 comprises source 110, a gate 120, a drain 130, barrier layer 140 and body layer 150. The transistor 200 in FIG. 2 comprises a source 210, gate 220, drain 230, field plate 240, and barrier layer 250 and body layer 260. In typical Si MOSFETs, oxides such as SiO2 or other dielectric materials are deposited onto a Si surface (i.e., body layer 150 or 260). A conducting channel 190 typically is formed at SiO2/Si interface through a process called inversion by which the mobile carriers are induced by the gate voltage. For the case of GaN HEMT, body layers 150 and 250 may comprise gallium nitride and barrier layers 140 and 260 may comprise aluminum gallium nitride and/or additional dielectric material. Referring to FIG. 1, in response to the gate voltage, electric charges 180s are induced at the interface between barrier layer 140 and body layer 150. Because typically both barrier layer 140 and body layer 150 are free from intentionally doped impurity, the mobility of the electrons is higher than that of conventional n-type semiconductor. For illustration purpose, in the following sections, n-channel AlGaN/GaN HEMT is described below but one of ordinary skill in the art would understand that other types of HEMT or MOSFETs operate in similar fashion except the exact location of charges may be different.

Regarding FIG. 1, when a voltage higher than saturation voltage is to transistor 100, electric charges 180 appear in the transistor 100 within a conducting channel 190. The gate 120 usually comprises metal and certain negative charges 160 are induced at the interface between the barrier layer 140 and body layer 150. Due to the geometry and metal composition of the gate 120, electric fields 170 from these certain negative charges 160 concentrate at the corner of the gate 120.

A conventional solution to reduce the concentration of the electric field at the corner of the gate 120 is the use of a metal field plate 240, as shown in FIG. 2. The field plate 240 is another metal layer that extends over the gate 120 but is positioned slightly further away from the conducting channel 295. When a voltage higher than saturation voltage is applied to transistor 200, electric charges 290 appear within the conducting channel 295. One of ordinary skill in the art would understand that the electric fields 270 generated from electric charges 280 by an applied voltage are not limited to only those shown in FIG. 2. The electric fields 270 shown are representative of the localized electric fields generated from the certain electric charges 280 that concentrate along the bottom surface and at the corner of the conventional field plate 240.

Rather than concentrating at the corner of gate 220, the electric fields 270 are distributed along the bottom surface of the field plate 240. By preventing the electric fields 270 from concentrating at the corner of the gate 220 and redistributing the electric fields 270 to the bottom surface of the field plate 240, the field plate 240 increases the distance of the electric fields 270 from the conducting channel 295. As a result, in comparison to a transistor 100 without a field plate, the breakdown voltage of the transistor 200 with a field plate 240 is increased.

Conventional field plate designs consist of layers of metal. Metal field plates, while achieving a reduction in electric fields at lower voltages, exhibit the same problem of localized concentration of electric fields as the applied voltage increases. In other words, as the electric charges 290 increases (as a result of the increased voltage) within the conducting channel 295, electric fields 270 concentrate at the corner of the field plate 240. Therefore, the effectiveness of the field plate 240 is diminished as the applied voltage increases, which limits the application of the field plate 240 for high-voltage applications. These problems have become particularly prevalent with any high-voltage transistors such as gallium nitride HEMTs and silicon MOSFETs.

To remedy the localized electric field at the corner of the metal field plate, conventional solutions have included adding a second field plate. Examples of this solution can be found in the following references: Saito et al., "Current Collapseless High-Voltage GaN-HEMT and its 50-W Boost Converter Operation," and Xing et al., "High Breakdown Voltage AlGaN—GaN HEMTs Achieved by Multiple Field Plates," both of which are incorporated herein by reference. These references disclose conventional field plates where the second field plate also is made of metal and therefore, the electric field still develops at the corners of the second field plate. The electrical field along the channel of a conventional GaN HEMT device generally exhibits sharp peaks at the corners of the metal structures such as the end of the gate metal or the end of field plates. Moreover, adding additional field plates increases both complexity and cost of manufacturing.

The reason for the formation of peaks at the corners is explained by the electric charge crowding properties for metal. These electric charges are induced by the position charges in the channel when the high drain voltages are applied to the drain contact. The positive charges appear as the result of the depletion of two-dimensional electron gas (2DEG). The high electric field at the corners of the field plate increases the risk of voltage breakdown of the transistor.

Because of charge crowding effect at the boundaries of the gate and metal field plates, conventional metal field plates present sub-optimized solutions no matter how many conventional field plates are used. Moreover, while increasing the coverage of the field plate over a region allows for higher voltages to be sustained without reaching the breakdown field, this increased coverage also increases the distance between the drain and the gate, which increases on-resistance.

Previous attempts to improve upon conventional field plates have relied on increasing the distance between the electric charges. Voltage is developed by electric field over distance. E=−∇V. And, electric field is originated from charge:

$$\nabla \cdot E = \frac{\rho}{\varepsilon}$$

(Poisson equation, where ρ is charge density and c is the permittivity of the material). Thus, one solution to reduce the electric field with as voltage increases involves increasing the distance between corresponding positive and negative charges, i.e., moving the electric field away from the channel.

Another recent approach is the concept of gate-connected slant or sloping field plates to increase the distance between the field plate and the semiconductor substrate. The increased distance reduces the peak electric field near the conducting channel for high voltage breakdown operation. While slanted structures offer one solution over conventional field plates, such structure are difficult to fabricate using traditional lithography processes.

However, the problem with any solution using conventional metal field plates is that metal is known to have high free electron density and therefore provides charges near the surface of the metal. With any metal field plate, a high density of charges accumulate near the corner of the metal field plate. Therefore, there has been a long felt need for a solution to these issues to reduce the maximum electric field of these transistors when high voltages are applied without further complicating the manufacturing process.

SUMMARY

The present disclosure is directed to a high-voltage semiconductor structure comprising a semiconductor layer, a source electrode, gate electrode and drain electrode formed on the semiconductor layer, a field effect transistor (FET) channel region formed in the semiconductor layer and connecting the source electrode and the drain electrode, and at least one field plate formed in a region between the gate electrode and the drain electrode, and electrically connected to the gate electrode, wherein the at least one field plate comprises a doped semiconductor material.

DETAILED DESCRIPTION OF THE INVENTION

A field plate made of depletable material according to preferred embodiments of the present disclosure will now be described more fully with reference to the accompanying drawings. The drawings are not necessarily to scale and certain features of the disclosure may be shown exaggerated in scale or in somewhat schematic form in the interest of clarity and conciseness. For example, the electric fields in the figures are drawn as straight lines to merely show the effect of the applied voltage but these lines are not necessarily representative of actual electric fields.

In describing various embodiments, specific terminology is employed for the sake of clarity. However, the disclosure is not intended to be limited to the specific terminology used in this specification. It is to be understood that each specific element includes all technical equivalents which operate in a similar manner to accomplish a similar purpose.

The present disclosure solves the issues associated with metal field plates by utilizing depletable materials in the composition of a field plate. Depletable field plates are made of materials with limited charge density, such as doped semiconductors. As an example, for n-type FETs, field plates comprising p-type doped semiconductor material can be used. The p-type doped semiconductor material may be p-type poly-silicon. Conversely, for p-type FETSs, field plates comprising n-type doped semiconductor material can be used. In a one embodiment, boron may be selected as the dopant in silicon. Arsenic and phosphorous are other examples of dopants that may be used in silicon.

While conventional metal field plate designs give a sub-optimal tradeoff between the on-resistance and the breakdown voltage of the FET structures due to its limited effectiveness of reducing the highest electric field, field plates made of depletable materials provide a better tradeoff between the on-resistance and the breakdown voltage by more efficiently shaping and reducing the electric field. This improvement in reducing the electric field results in better device performance and enhancing the reliability of the devices. Because of these benefits, the present disclosure is particularly useful for high voltage HEMTs or MOSFETs.

The choices of the material for the depletable field plate may be any material having a lower carrier density than metal such as a doped semiconductor material (e.g., single crystal, poly-crystal, or lightly doped poly-silicon) or metal alloys with low carrier density such as (TiN, etc.). For n-channel FET where the drain voltage is positive, it is preferred to use p-type semiconductor for the depletable field plate since negative charges are present when the majority carriers (hole in p-type semiconductor) are driven away under the reversed bias condition.

Figure 3A:
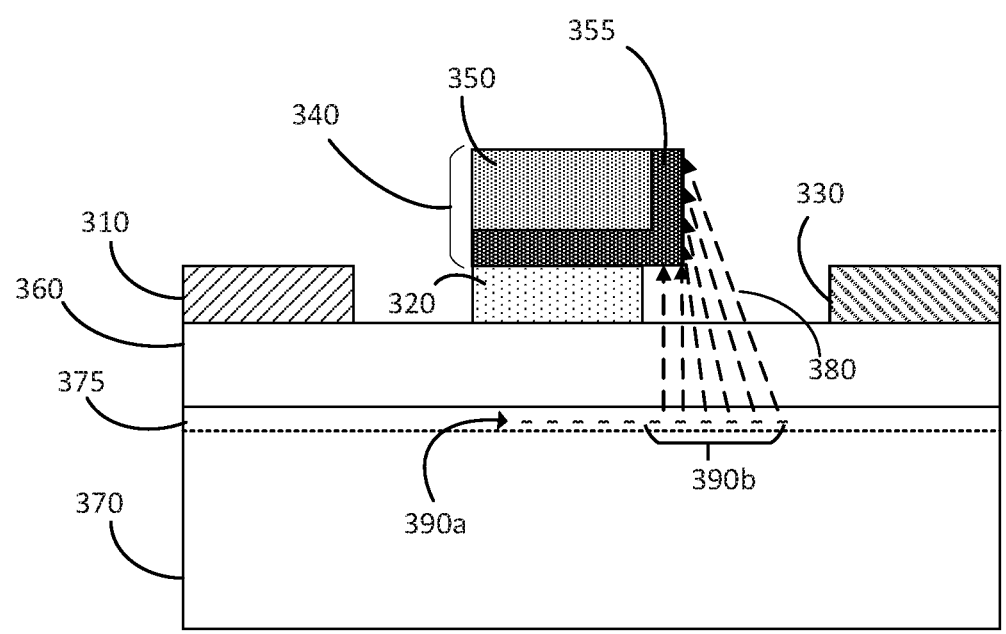
FIG. 3A is a cross-sectional view of a transistor with a field plate of the present disclosure illustrating the effect of an applied voltage on the distribution of an electric field in an embodiment of the disclosure.

Illustrated in FIG. 3A is a cross-sectional view of a transistor 300 with a field plate 340 in accordance with an embodiment of the present disclosure. The transistor 300 comprises a source electrode 310, a gate electrode 320, a drain electrode 330, barrier layer 360 and body layer 370. Barrier layer 360 and body layer 370 may comprise materials that are generally used in high-voltage transistors. For example, barrier layer 360 may be aluminum gallium nitride (AlGaN) and body layer 370 may be gallium nitride (GaN). As discussed above, field plate 340 comprises a material having a limited charge density, such as doped semiconductor material. Field plate 340 may be doped in either a uniform or non-uniform manner, and comprises a depletion region 355 and an undepleted region 350 when a voltage is applied to the transistor 300. In one embodiment, it might be preferable to have heavily doped region at the opposite side of the gate electrode 320 to enhance the conductivity of the depletable field plate 340. The width or thickness of the field plate 340 can range from 100 nanometers to a few micrometers. One criteria for the width of the depletable field plate is to avoid fully depleting the depletable field plate under the desired applied voltage.

The depletion region 355 in the field plate 340 increases the break-down voltage of the transistor 300 by increasing the distance of the electric field 380 generated from certain charges 390$b$ from the conducting channel 375. Because of the doping concentration of the field plate 340, the depletion region 355 extends in a direction away from the gate electrode 320. This formation is important because the electric field 380 is distributed along the surfaces of the depletion region 355 of the field plate 340. Because the electric fields 380 are uniformly distributed along the depletion region 355 of the field plate, the distances between the conducting channel 375 and the electric field 380 is effectively increased. Thus, the breakdown voltage of a field plate of the present disclosure is also increased.

When a high drain voltage is applied to the transistor 300 that results in electric charges 390$a$ to form within the conducting channel 375, the majority carrier in the depletion region 355 in the field plate is driven away leaving a negative space charge. In one embodiment, a voltage applied across the gate and the source may vary from –20 volts to +10 volts, while the voltage applied across the drain and the source may exceed 5000 volts, depending on the applications.

Increasing the drain voltage would result in increasing the thickness of the depletion region. When the drain voltage is sufficiently high, charges 390$a$ appear in the conducting channel 375 outside the field plate 340 and a bottom surface and sidewall of the field plate 340 starts to be depleted. The use of a depletable material results in the field plate 340 having a limited charge density that is lower in comparison to the high charge density of a metal material. The electric fields 380 generated from electric charges 390$b$ are prevented from concentrating at the corner of the field plate 340. In contrast to conventional field plates, the presence of the depletion region 355 uniformly distributes the electric fields 380 along the sides of the field plate 340.

In one embodiment, the transistor 300 is an n-type field effect transistor and the doped semiconductor material, which forms the depletion region 355 is p-type poly-silicon. Boron can be used as the dopant for silicon semiconductor material. The doping concentration of the doped semiconductor material can range from $1 \times 10^{16}$ cm$^{-3}$ to $1 \times 10^{19}$ cm$^{-3}$ depending on the design of the transistor. The doping concentration affects the width of a depletion region 355 of the field plate 340.

Because of the presence of the depletion region 355 and its position adjacent to the gate electrode 320, the field plate 340 redistributes the electric fields 380 along a side wall of the field plate 340 and away from the conducting channel 375. This arrangement of the depletion region 355 within the field plate 350 results in increasing the distance of the electric field 380 from the conducting channel 375.

In comparison to conventional metal field plates which allowed a generated electric field to concentrate at the corner of the metal field plate, the depletion region in the field plate of the present disclosure forces an electric field to be substantially uniformly distributed along the entire field plate, i.e., the electric field cannot concentrate at the corner of the field plate of the present disclosure.

Figure 3B:
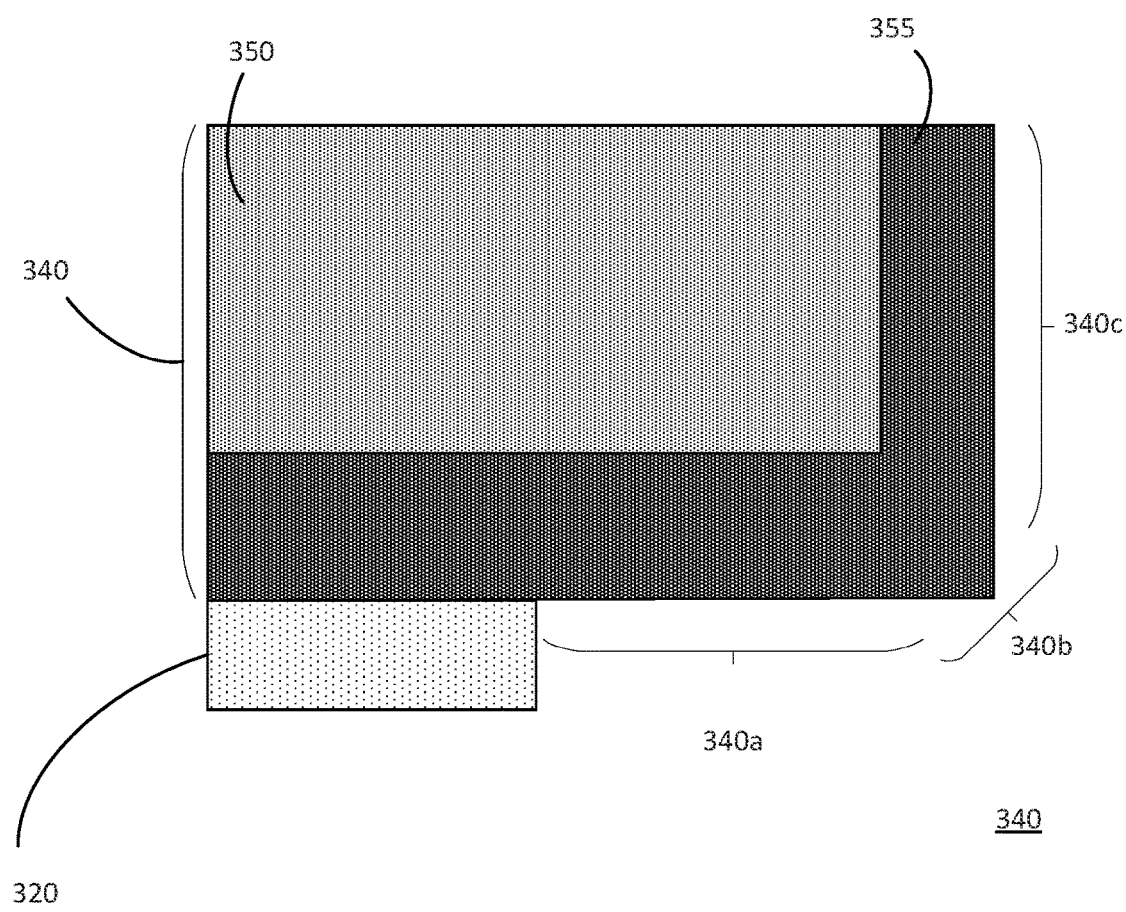
FIG. 3B is a close-up view of the field plate shown in FIG. 3(a) illustrating the effect of an applied voltage on the distribution of an electric field in an embodiment of the disclosure.

FIG. 3B provides a magnified view of the field plate 340 shown in FIG. 3A. For purposes of clarity, various elements shown in FIG. 3A are omitted. As previously discussed, field plate 340 comprises a depletion region 355 and an undepleted region 350. The field plate 340 may be considered to include a first region 340$a$ located on a bottom surface of field plate 340. In one embodiment, the field plate 340 is electrically connected and adjacent to the gate electrode 320. In another embodiment, the field plate 340 is electrically connected to the source electrode 310 instead of gate electrode 320. The field plate 340 may further include a second region 340$b$ that is adjacent to the first region 340$a$. The second region 340$b$ includes a corner of the field plate 340 at the intersection of the bottom surface and a side surface of the field plate 340. The field plate 340 may further include a third region 340$c$ that is located on the side surface of the field plate 340, and is adjacent to the second region 340$b$.

Figure 1:
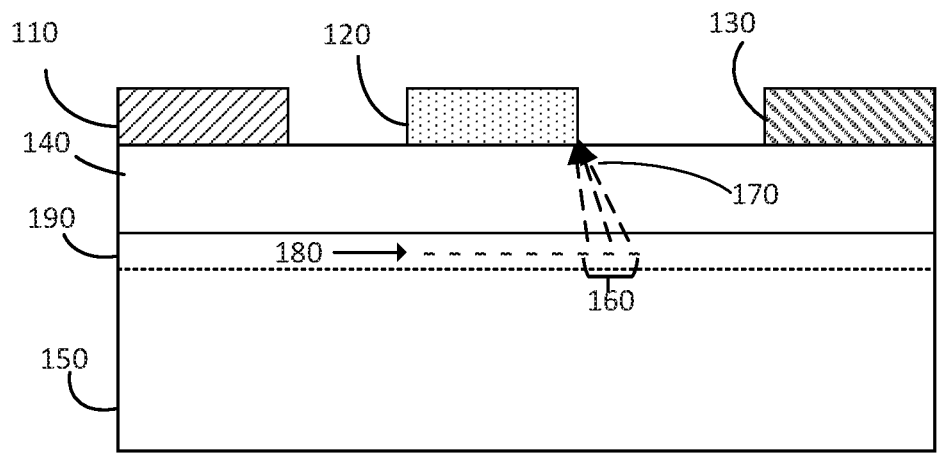
FIG. 1 is a cross-sectional view of a conventional transistor illustrating the effect of an applied voltage on the distribution of an electric field.
Figure 2:
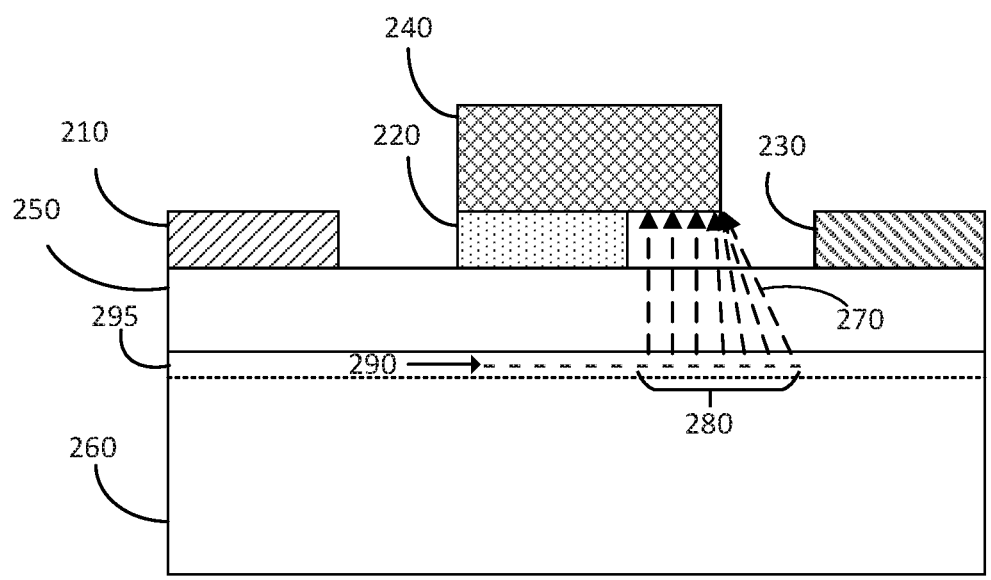
FIG. 2 a cross-sectional view of a conventional transistor with a conventional field plate illustrating the effect of two different applied voltages on the distribution of an electric field.

As discussed above with respect to FIG. 3A, the depletion region 355 spans the bottom surface of field plate 340$a$, which includes regions 340$a$ and 340$b$ as well as the side surface of field plate 340, which includes regions 340$b$ and 340$c$. An electric field generated by an applied voltage (not shown in FIG. 3B) is substantially uniformly distributed amongst at least regions 340$a$, 340$b$, and 340$c$ of the field plate 340. This substantial uniform distribution along regions 340$a$, 340$b$, and 340$c$, which include portions of the bottom surface, corner, and side surface of the field plate 340, is in contrast to conventional field plates where there is a concentration of the electric field at the corner of the field plate (as shown in FIG. 1). The breakdown voltage of conventional field plates is limited because the distance between the locally concentrated electric field (at the corner of the field plate) and the conducting channel 375 is limited.

The distance in which the electric fields 380 is redistributed away from the conducting channel 375 depends on the width of the depletion region 355 within the field plate 340. Because of the lack of carriers in the depletion region 355, the field plate uniformly distributes the electric fields 380 along the field plate's first 340$a$, second 340$b$, and third 340$c$ regions.

As discussed above, voltage is developed by electric field over distance. E=–∇V. And, electric field is originated from charge:

$$\nabla \cdot E = \frac{\rho}{\varepsilon}.$$

Thus, as the voltage that is applied to the transistor increases, so does the electric field. However, the effect of the increased voltage can be mitigated by the field plate of the present disclosure because of the presence of the depletion region within the field plate, which increases the distance of the electric field from the channel and substantially uniformly distributes the electric field along the surfaces of the field plate. Therefore, the greater the width of the depletion region, the further away from the substrate the electric fields are distributed.

The limited charge density in the depletion region 355 prevents the electric fields 380 from concentrating at the corner of the field plate 340. The width or thickness of the depletion region 355 varies depending on the doping concentration of the field plate 340 and can be adjusted depending on the needs of the transistor application. Generally, there is an inverse relationship between the doping concentration of the field plate and the width of the depletion region that is formed; so as doping concentration increases, the width of the field plate decreases, and vice versa.

Figure 3C:
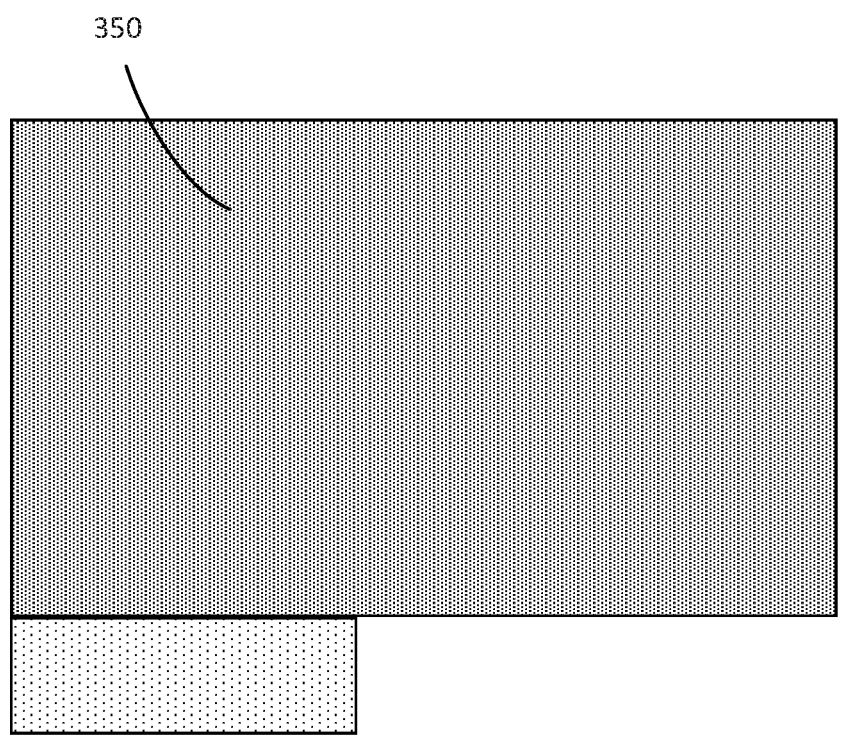
FIG. 3C is close-up view of the field plate shown in FIG. 3(a) without a sufficiently high voltage being applied to the transistor.

In FIG. 3C, field plate 340 is illustrated with a fully undepleted region 350 when the voltage applied (if any) to the transistor 300 is not sufficiently high as described above.

In addition to the material of the field plate, the geometries of the field plates can also play an important role in manipulating the electric fields that are generated. Together, the shape and the material properties of the depletable field plate will determine the effectiveness to improve the breakdown voltage of the transistor. The geometry of the depletable field plate can be adjusted which adds another dimension of optimization.

Figure 4:
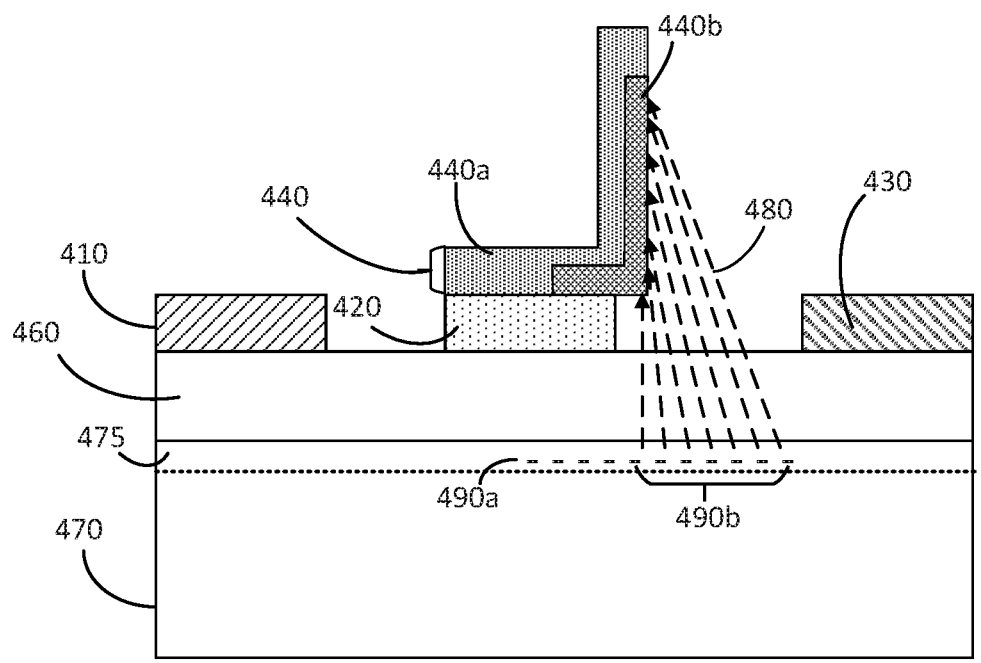
FIG. 4 is a cross-sectional view of a transistor having a non-planar geometry with a field plate of the present disclosure illustrating the effect of an applied voltage on the distribution of an electric field in another embodiment of the disclosure.

FIG. 4 illustrates an embodiment of a non-planar geometry for a field plate 440 that is possible with the present disclosure. In this embodiment, the transistor 400 comprises a source electrode 410, a gate electrode 420, drain electrode 430, barrier layer 460, and body layer 470. Transistor 400 further comprises a field plate 440 which is arranged adjacent to the gate electrode 420 and in a horizontal direction relative to transistor 400. Charges 490a may appear at the interface between the barrier layer 460 and the body layer 470 when a sufficiently high voltage is applied to the transistor 400. In this embodiment, field plate 440 has an L-shaped geometry and comprises a depletion region 440b and undepleted region 440a. Although only an L-shaped geometry is described, other shapes that distribute the electric fields 480 caused by charges 490b away from conducting channel 475 are within the scope of the invention.

With the L-shape geometry of this embodiment, the electric fields 480 from electric charges 490b are distributed along bottom and side surfaces of the field plate 440. The electric field 480 may be distributed along the length the depletion region 450b within field plate 450. Thus, the distance in which electric fields 480 is distributed from conducting channel 475 can be adjusted by adjusting the length of the depletion region 450b of field plate 450. Such geometry would not be effective in distributing the electric field using conventional field plates because the charges would remain concentrated at the corner of the field plate. As would be clear to one of ordinary skill in the art, the present disclosure is not limited to the L-shaped geometry discussed above. Additional field plates comprising doped semiconductor materials and different geometries can be employed to redistribute the electric charges depending on the needs of the transistor.

Other objects, advantages and embodiments of the various aspects of the present disclosure will be apparent to those who are skilled in the field of the disclosure and are within the scope of the description and the accompanying Figures. For example, but without limitation, structural or functional elements might be rearranged consistent with the present disclosure. Similarly, principles according to the present disclosure could be applied to other examples, which, even if not specifically described here in detail, would nevertheless be within the scope of the present disclosure.

What is claimed is:

1. A high-voltage semiconductor structure comprising:
   at least one semiconductor layer;
   a source electrode, gate electrode and drain electrode formed on the at least one semiconductor layer; and
   a field plate having a depletion region extending along a bottom surface facing the at least one semiconductor layer and a side surface, the field plate formed between the gate electrode and the drain electrode, and electrically connected to the gate electrode or the source electrode,
   wherein the field plate comprises depletable material having a lower electron density relative to a metal.

2. The high voltage semiconductor structure of claim 1, wherein the depletable material comprises a doped semiconductor material.

3. The high-voltage semiconductor structure of claim 1, wherein the field plate is configured to substantially uniformly distribute electrical fields at least along the bottom surface and side surface of the field plate.

4. The high-voltage semiconductor structure of claim 1, wherein the field plate comprises a depletion region that is adjacent to the gate electrode, when a voltage is applied to the high-voltage semiconductor structure.

5. The high-voltage semiconductor structure of claim 4, wherein the field plate is non-uniformly doped.

6. The high-voltage semiconductor structure of claim 2, wherein a doping concentration of the doped semiconductor material ranges from $1 \times 10^{16}$ cm$^{-3}$ to $1 \times 10^{18}$ cm$^{-3}$.

7. The high-voltage semiconductor structure of claim 4, wherein the voltage is applied across the drain electrode and the source electrode is within the range from 0 volts to 5000 volts.

8. The high-voltage semiconductor structure of claim 4, wherein the voltage is applied across the drain electrode and the source electrode exceeds 5000 volts.

9. The high-voltage semiconductor structure of claim 2, wherein the doped semiconductor material comprises single crystal poly-silicon.

10. The high-voltage semiconductor structure of claim 1, wherein the at least one semiconductor layer comprises a first and second semiconductor layer.

11. The high-voltage semiconductor structure of claim 10, wherein the first semiconductor layer comprises gallium nitride or silicon carbide.

12. The high-voltage semiconductor structure of claim 10, wherein the second semiconductor layer comprises aluminum gallium nitride.

13. The high-voltage semiconductor structure of claim 1, wherein the field plate is L-shaped.

14. The high-voltage semiconductor structure of claim 12, wherein the field plate has a rectangular shape.

15. The high-voltage semiconductor structure of claim 12, wherein the field plate has a non-planar shape.

* * * * *